United States Patent [19]

Mills, III

[11] 3,948,694

[45] Apr. 6, 1976

[54] SELF-ALIGNED METHOD FOR INTEGRATED CIRCUIT MANUFACTURE

[75] Inventor: B. David Mills, III, Tempe, Ariz.

[73] Assignee: Motorola, Inc., Chicago, Ill.

[22] Filed: Apr. 30, 1975

[21] Appl. No.: 572,971

[52] U.S. Cl. ............... 148/187; 148/1.5; 148/175; 357/91
[51] Int. Cl.² ..................................... H01L 21/265
[58] Field of Search ............... 148/187, 175; 357/91

[56] References Cited
UNITED STATES PATENTS

| | | | |
|---|---|---|---|
| 3,595,716 | 7/1971 | Kerr et al. | 148/187 |
| 3,704,177 | 11/1972 | Beale | 148/1.5 |
| 3,783,047 | 1/1974 | Paffen et al. | 148/187 |
| 3,789,504 | 2/1974 | Jaddam | 148/187 X |
| 3,793,088 | 2/1974 | Eckton, Jr. | 148/1.5 |

Primary Examiner—L. Dewayne Rutledge
Assistant Examiner—J. M. Davis
Attorney, Agent, or Firm—Harry M. Weiss; Kenneth R. Stevens

[57] ABSTRACT

A method for manufacturing integrated circuits provides total self-alignment of all critically positioned device regions. Self-alignment is accomplished by a combination of selectively etchable thin layers on the surface of a semiconductor body. An initially formed predetermined pattern of openings defines all active regions of the device. Selective introduction of impurities in sub-sets of this predetermined pattern form regions of a semiconductor device in a totally self-aligned manner while ion implantation through all overlying layers provides for the formation of further shallow device regions irrespective of the predetermined pattern of openings.

9 Claims, 10 Drawing Figures

SELF-ALIGNED METHOD FOR INTEGRATED CIRCUIT MANUFACTURE

BACKGROUND

The present invention pertains in general to the fabrication of semiconductor devices and, in particular, to selfaligned methods for manufacturing high density integrated circuits.

A recent advance in the manufacture of high density integrated circuits has been the development of epitaxial base devices. Devices of this type are formed within thin epitaxial layers grown on the surface of a semiconductor substrate. One prior art method uses oxide to form the isolation region around a device and a buried layer under the device to form a collector region. Another method is collector diffused isolation (CDI) where an annular doped region is diffused down to contact a buried layer thus simultaneously delineating the base-collector and the collector-isolation junctions of the device. The major advantage in epitaxial base devices is that much smaller devices can be fabricated without causing emitter-collector shorts. Studies show that the incidence of emitter-collector shorts is inversely proportional to the width of the base region of a integrated circuit device. Thin epitaxial layers which can be formed with a uniform low concentration level allow the fabrication of devices with a wider base region with no sacrifice in current gain.

Another recent advance in fabricating high density integrated circuits is the use of self-aligning techniques. These techniques use selectively etchable thin layers with openings in one layer forming the etching mask for openings in subsequent layers to form a given device region. In oxide structures, self-aligning techniques have been used to simplify and compact the formation of base contacts and emitter regions within a given device. Oxide isolation precludes, however, the self-alignment of these regions with respect to the isolation region since the openings in the masking layer cannot be preserved during the long oxide growth cycle required to form the isolation region.

The diffusions used to form the collector region in a CDI integrated circit do not in themselves preclude selfalignment techniques but there is another reason why total self-alignment of emitter region, base metal contact and collector region cannot be obtained in conventional CDI structures. This is the fact that the overall surface of the base region of an epitaxial base device must receive higher doping if emitter efficiencies are to be maintained. Highest emitter efficiencies occur when injection of carriers from the emitter can be maximized in the base region directly under the emitter and minimized in the sidewall regions of the periphery of the emitter. Injection is a function of the impurity concentration (doping) of the emitter with respect to the base. Thus to maximize injection under the emitter, doping must be low in this region of the base whereas to minimize injection in emitter sidewall, doping must be high in this region of the base.

These requirements for improved emitter efficiency can be met by forming a thin, more highly doped layer at the surface of the base region. The depth of this more highly doped layer must be less than the depth of the emitter regions so that injection is retarded only in the sidewall regions of the emitter. A thin layer of this type can be formed by conventional diffusion techniques but the capability for self-alignment is then lost because the selectively etchable masking layers must be removed from the surface in order to accomplish the diffusion. Thus, prior art methods for the fabrication of epitaxial base integrated circuit structures have shown methods for self-alignment of regions interior to a given device or the formation of unpatterned shallow doped regions over the surface of the given device but not both.

SUMMARY

It is an object of this invention to provide an improved self-aligned method for manufacturing integrated circuits containing devices of the epitaxial base type.

It is a further object of this invention to provide an improved self-aligned method of manufacture in which the emitter, base contact, collector contact and collector regions of a device are all self-aligned with respect to each other.

It is a further object of this invention to provide an improved self-aligned method of manufacture in which total self-alignment is combined with the formation of a shallow unpatterned device region which encompasses the self-aligned device regions.

It is a further object of this invention to provide an improved self-aligned method of manufacture in which the formation of the shallow unpatterned region in conjunction with the total self-alignment is accomplished using ion implantation.

It is a further object of this invention to provide an improved self-aligned method of manufacture in which total self-alignment allows reduced spacings between adjacent devices within the integrated circuit structure and thus provides higher density integrated circuits with reduced cost of manufacture.

In accordance with the aforementioned objects, the present invention provides a self-aligned method for the manufacture of integrated circits wherein diffusion of impurities through a predetermined pattern of openings in a selectively etchable masking layer forms a portion of the desired device regions and ion implantation independent of the predetermined pattern of openings in the masking layer forms the remainder of the desired device regions to provide a high density integrated circuit structure with optimum device characteristics in an epitaxial base structure.

DETAILED DESCRIPTION

The self-aligned method of integrated circuit fabrication of the present invention will now be described in terms of the detailed fabrication steps used to manufacture the preferred embodiment together with the attached figures which show the structure of the integrated circuit device being fabricated at various stages in the process. To simplify the discussion, conventional process steps will be described only briefly, whle those steps relating to the novel aspects of the process will be described in greater detail.

Figure 1:
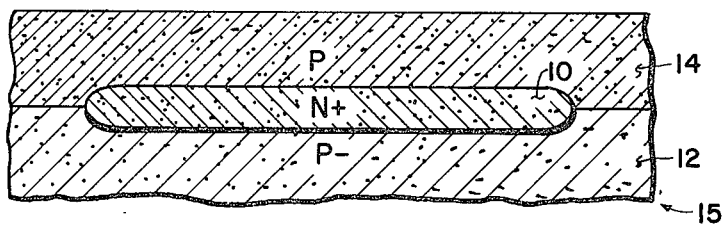
FIG. 1 through FIG. 9 show cross sectional views of a semiconductor substrate at various stages of the manufacturing method of the present invention.

Initially as shown in FIG. 1 and using conventional techniques, a N+ buried layer 10 is formed in a P type semiconductor body 12 by diffusing an arsenic impurity into the semiconductor body 12 and thereafter growing a thin P type epitaxial silicon layer 14 (typically 0.5 ohm-centimeter resistivity, 1.6 microns thick) to obtain the resulting substrate 15.

Figure 2:
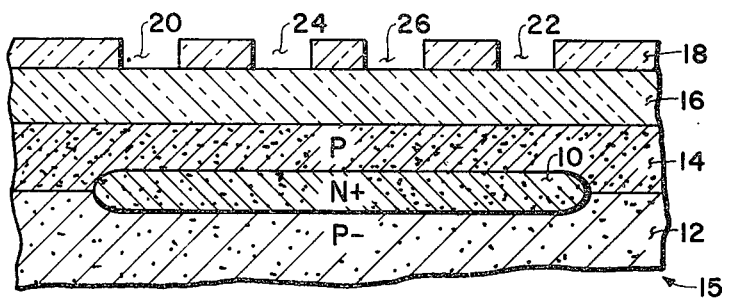

In the steps of FIG. 2, the surface of substrate 15 is now coated with 2,500 angstroms of thermally grown silicon oxide to form layer 16 and then a 1,000 angstrom layer of silicon nitride is deposited over the surface of layer 16. This procedure provides selectively etchable layers over the surface of substrate 15 which will be used in subsequent process steps. Using conventional photoresist and etching techniques, a master mask 18 is formed in a single step defining a predetermined pattern of openings 20 and 22, 24 and 26 which are later employed for forming collector/collector contact, emitter and base contact regions respectively. Openings 20 and 22 are two portions of the same annular ring delineating the collector. A nitride etchant is used to etch through the silicon nitride layer and then the photoresist layer is stripped away leaving the master mask structure 18 shown in FIG. 2. At this point, all critical regions of a semiconductor device have been precisely defined by openings etched through the silicon nitride mask 18. The regions defined are therefore self-aligned with respect to each other.

Figure 3:
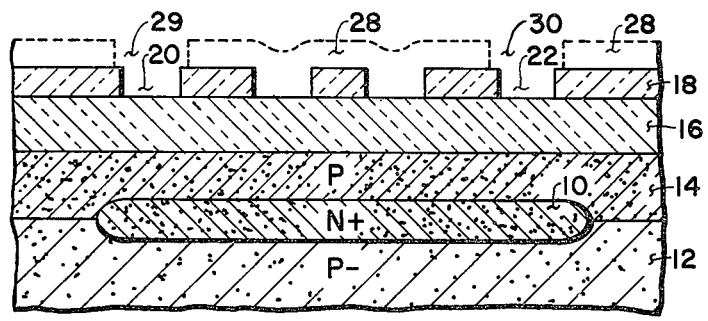

In the step of FIG. 3, a photoresist layer 28 with an annular oversize opening 29 and 30 allows the annular collector region opening 20 and 22 of the nitride layer 18 to serve as the precision etch mask for subsequent etching through the oxide layer 16. The key element of this step is that the precisely defined device regions of the silicon nitride layer will serve as the mask for subsequent etching steps. The overside photomask does not require critical alignment. Thus, the precisely defined annular opening 20 and 22 in the silicon nitride layer 18 is enabled by the annular oversized opening 29 and 30 in the photoresist layer.

Figure 4:
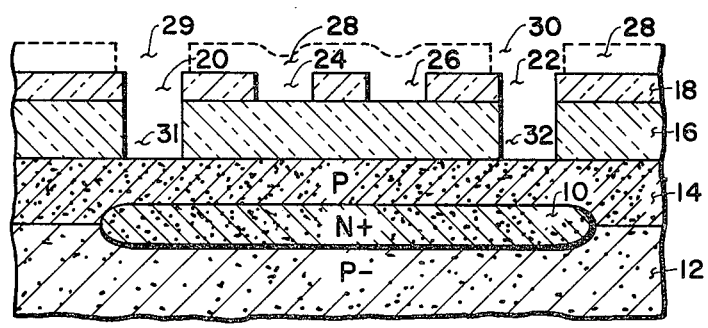

In the process step of FIG. 4, openings 31 and 32 have been etched through the silicon oxide layer 16 in correspondence with the predetermined openings 20 and 22 in the silicon nitride layer 18. The openings 24 and 26 in the silicon nitride layer 18 are not affected by the oxide etchant in this process step because they are covered by the overlying photoresist layer 28.

Figure 5:
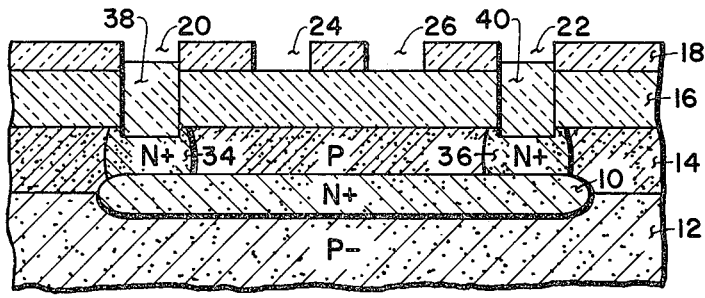

In the process step of FIG. 5, an N type impurity is diffused through the openings in the silicon oxide layer 16 to form the diffused regions 34 and 36 which contact the buried layer 10 forming the collector region of the device and defining the boundaries of the device within the P type epitaxial layer 14. After this diffusion, the surface of the semiconductor structure is reoxidized forming silicon dioxide regions 38 and 40 which fill the openings in the silicon dioxide layer 16. Although openings 24 and 26 were present in the silicon nitride layer 18, the N type diffusions 34 and 36 forming the collector region have had no effect on the silicon surface under these openings because the unetched silicon dioxide layer provided a barrier to diffusion through these openings.

Figure 6:
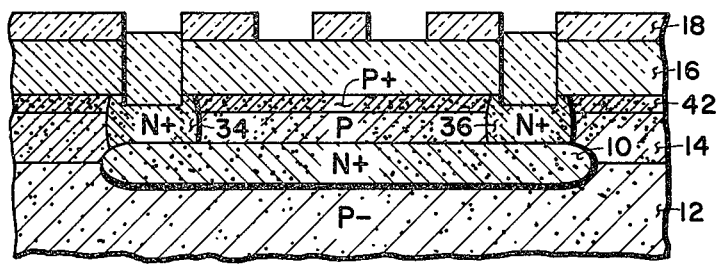

In the process step of FIG. 6, a thin region 42 of higher concentration P type material is now formed at the upper surface region of the P type epitaxial layer 14. This thin region is formed by ion implantation at an acceleration voltage of approximately 190 Kv. Significantly, due to the high energy of the ion implantation, the implantation can take place through the silicon nitride layer 18 and/or the silicon dioxide layer 16. This allows the thin layer or region 42 of higher concentration P type material to be formed over the entire surface of the semiconductor structure irrespective of the pattern of openings that have been etched in the silicon nitride layer 18. Although P type impurities are implanted in the annular collector region 34 and 36, the net doping of this region remains N type because of a higher concentration of N type impurities from the collector diffusion.

Figure 7:
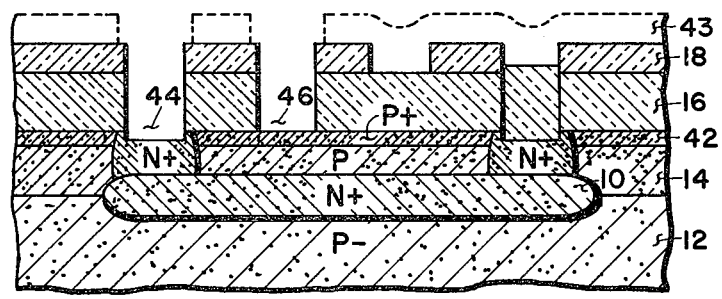
Figure 10:
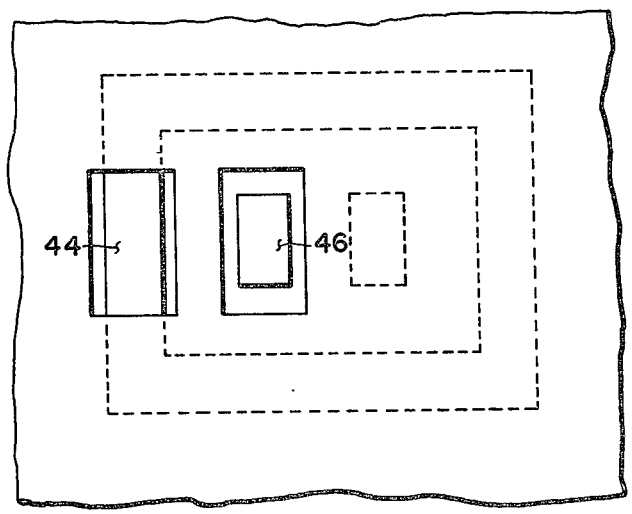
FIG. 10 shows a top view of a device region on a semiconductor substrate at the stage of manufacture represented by FIG. 7.

In the process step of FIG. 7, a patterned photoresist layer 43 is formed by employing an oversize photomask. A suitable etching step then forms openings 44 and 46 in the silicon dioxide layer 18 in the manner previously described with respect to FIGS. 3 and 4. Openings 44 and 46 define the regions where diffusions will form the collector contact and emitter regions of the device respectively. The oversize photomask used in this step is uncritical with respect to alignment and once again the precisely defined openings in the silicon nitride layer 18 will act as a precision mask for the oxide etching performed through exposed silicon surface subject subsequent to diffusion. While the collector diffusion previously discussed formed a diffused ring defining the periphery of the semiconductor device, the collector contact diffusion through opening 44 will only contact a portion of this ring. FIG. 10 shows a top view of the semiconductor device with openings in the photoresist layer 43 and openings in the silicon nitride layer 18 defining openings 44 and 46 in the silicon dioxide layer 16.

Figure 8:
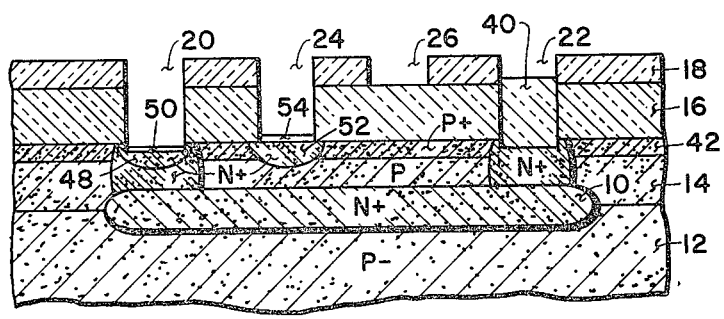

In the process step of FIG. 8, N type impurities have been diffused into the P type silicon layer 14 to form the diffused collector contact region 48 and emitter region 52. Oxidation is performed during the diffusion cycle to grow approximately 300 angstroms of silicon dioxide for forming a layer 50 and a layer 54 over the diffused regions 48 and 52 respectively.

Figure 9:
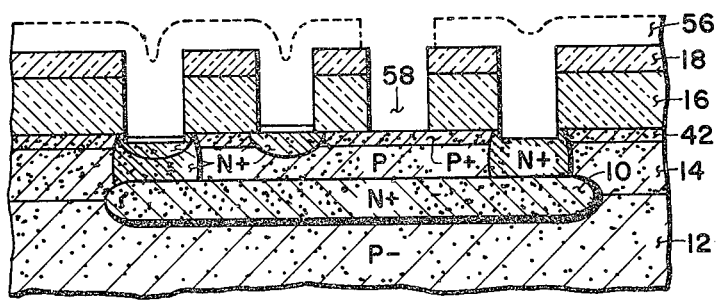

In the process step of FIG. 9, a patterned photoresist layer 56 is defined by an oversize photomask. After a silicon dioxide etching step, opening 58 is formed so as to expose the P type silicon surface to allow the formation of a base contact region. Since the opening in the silicon nitride layer 18 was made using the master mask procedure described above, the base contact region is self-aligned with respect to the other regions.

Thereafter conventional process steps of etching to expose contact areas, metallizing, metal masking, metal etching and final passivation to protect the surface, are employed to complete the device.

What is claimed is:
1. A self-aligned method of manufacturing integrated circuits comprising the steps of:
   a. providing a buried layer and an upper layer over a semiconductor substrate, said upper layer and said substrate being of a first conductivity type, and said buried layer being of a second conductivity type opposite to said first conductivity type;
   b. forming a single masking means over the upper surface of said upper layer, said single mask means having a predetermined pattern of openings formed therein;
   c. forming a semiconductor device by applying impurities through said predetermined pattern of openings formed in said forming step and by applying impurities through portions of said masking means not constituted by said predetermined pattern of openings.

2. A self-aligned method of manufacturing integrated circuits comprising the steps of:
   a. providing a semiconductor substrate of a first conductivity, said semiconductor substrate having an overlying layer of a second conductivity;
   b. depositing a single masking means over the upper surface of said overlying layer, said single masking means having a predetermined pattern of openings formed therein;
   c. forming regions of a semiconductor device by applying impurities through said predetermined openings;
   d. forming a further shallow device region, encompassing said device regions formed by applying impurities through said predetermined openings, said shallow device region being formed irrespective of said predetermined openings.

3. The self-aligned method of manufacturing integrated circuits recited in claim 2 wherein said single masking means comprises at least two layers which are selectively etchable with respect to each other.

4. The self-aligned method of manufacturing integrated circuits as recited in claim 3 wherein at least one of said layers is silicon dioxide.

5. The self-aligned method of manufacturing integrated circuits as recited in claim 3 wherein at least one of said selectively etchable layers is silicon nitride.

6. The self-aligned method of manufacturing integrated circuits recited in claim 2 wherein said upper layer is an epitaxially deposited silicon layer.

7. The self-aligned method of manufacturing integrated circuits recited in claim 2 wherein said semiconductor substrate is silicon.

8. The self-aligned method of manufacturing integrated circuits recited in claim 2 wherein said device regions formed by applying impurities through said predetermined pattern of openings comprise the collector region, base region, and emitter region of a transistor.

9. A self-aligned method of manufacturing integrated circuits comprising the steps of:
   a. providing a buried layer and upper layer over a semiconductor substrate, said upper layer and said substrate being of a first conductivity type and said buried layer being of a second conductivity type opposite to said first conductivity type;
   b. depositing a first masking layer over the upper surface of said upper layer;
   c. depositing a second masking layer over the upper surface of said first masking layer;
   d. forming a predetermined pattern of openings in said second layer, said predetermined pattern comprising a first, a second, and a third group of openings;
   e. forming a first group of semiconductor device regions by applying impurities through openings etched through said first masking layer using said first group of openings as an etching mask;
   f. forming a second group of semiconductor device regions by applying impurities through openings etched through said first masking layer using said second group of openings as an etching mask;
   g. forming a shallow device region, said shallow device region overlaying the upper surfaces of said first and said second group of device region and said shallow device region being formed irrespective of said predetermined pattern of openings;
   h. forming a group of contact openings through said first masking layer using said third group of openings as an etching mask.

* * * * *